(12) United States Patent
Abramovitch

(10) Patent No.: US 6,973,599 B2
(45) Date of Patent: Dec. 6, 2005

(54) METHOD OF AND SYSTEM FOR CONSTRUCTING VALID DATA FOR MEMORY-BASED TESTS

(75) Inventor: Daniel Y. Abramovitch, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 552 days.

(21) Appl. No.: 09/967,287

(22) Filed: Sep. 28, 2001

(65) Prior Publication Data

US 2003/0065991 A1 Apr. 3, 2003

(51) Int. Cl.[7] .............................................. G06F 11/00
(52) U.S. Cl. ..................... 714/704; 714/800
(58) Field of Search ............... 714/704, 705, 714/708, 712, 715, 798, 800; 375/224; 370/517

(56) References Cited

U.S. PATENT DOCUMENTS 5,764,651 A * 6/1998 Bullock et al. ............. 714/708
6,263,443 B1 * 7/2001 Anderson et al. ........... 713/201
6,310,911 B1 * 10/2001 Burke et al. ................ 375/224
6,591,383 B1 * 7/2003 Michel et al. .............. 714/704
6,658,607 B1 * 12/2003 Michel et al. .............. 714/712
6,738,395 B1 * 5/2004 Diaconescu et al. ........ 370/517

OTHER PUBLICATIONS

Adams, Douglas, "Dirk Gently's Holistic Detective Agency," Simon & Schuster, Inc., New York, NY, 1987, p. 68-71.

* cited by examiner

Primary Examiner—Shelly Chase

(57) ABSTRACT

Bit-error-rate (BER) testing includes a data pattern generator transmitting a known data pattern to a device under test (DUT), which processes the data pattern and outputs the processed data pattern to an error analyzer. BER testing of telecommunications systems often uses data patterns in the form of SONET or SDH frames, which have error-checking bytes known as B bytes. The B Bytes computed for a given SONET or SDH frame are inserted into a next SONET or SDH frame. In memory-based BER tests, a fixed number of SONET or SDH frames is input to the DUT by the pattern generator. The last frame of the data pattern is adjusted so that the B bytes calculated using the last frame match the B bytes present in the first frame, which approach avoids parity errors that can occur in response to B byte mismatches between the last and the first frame.

48 Claims, 2 Drawing Sheets

METHOD OF AND SYSTEM FOR CONSTRUCTING VALID DATA FOR MEMORY-BASED TESTS

BACKGROUND OF THE INVENTION

1. Technical Field of the Invention

The present invention relates to bit-error-rate testing using memory-based data patterns and, more particularly, to construction of valid data for memory-based testing of telecommunications systems. Embodiments of the present invention construct valid memory-based data patterns that avoid parity errors between the frames of the data pattern.

2. Description of Related Art

Bit error rate test systems can be used to verify the performance of many systems, including telecommunications equipment. Bit-error-rate testing is a subset of time-domain testing. An exemplary bit-error-rate test system 100 is shown in FIG. 1. The bit-error-rate test system 100 includes a data pattern generator 102 and an error analyzer 104, each of which is connected to a device under test (DUT) 106. The DUT is not considered to be a part of the bit-error-rate test system 100, but is rather connected to the bit-error-rate test system 100. The data pattern generator 102 generates a predetermined data pattern that is input to the DUT 106. The error analyzer 104 compares data output by the DUT 106 to the predetermined data pattern and calculates a bit error rate (BER) of the DUT 106. The data pattern generator 102 most often has as an input a clock 108 that triggers generation of data by the data pattern generator 102.

In order to conduct bit-error-rate testing, the error analyzer 104 is typically clocked at the same rate as the data pattern generated by the data pattern generator 102. The clocking is often accomplished either by triggering the error analyzer 104 from the same clock 108 that is connected to the data pattern generator 102 via a clock recovery block 110. In the alternative, the error analyzer 104 can recover the clock 108 from the data output by the DUT 106 via the clock recovery block 110 as shown by dashed lines. The choice often depends upon the application and the proximity of the error analyzer 104 to the data pattern generator 102.

Bit-error-rate tests can be performed when the error analyzer 104 is thousands of miles from the data pattern generator 102. When large distances separate the error analyzer 104 and data pattern generator 102, recovering the clock 108 from the data output by the DUT 106 is a more likely choice. In other situations, the configuration of the DUT 106 might be such that the data pattern generator 102 and the error analyzer 104 are co-located and can be fed by the same clock.

The data pattern input to the DUT 106 must be a known pattern. The most common types of data patterns are Pseudo Random Bit Sequences (PRBS), Pseudo Random Word Sequences (PRWS), and memory-based data patterns. Memory-based data patterns are typically loaded into memory of the data pattern generator 102 before a test is begun and are output by the data pattern generator 102 during the test.

PRBSs are usually sequences generated from a combination of shift registers and logic. The data of a PRBS appears to be random but is actually deterministic. Families of known, standard PRBSs are commonly used for testing various types of channels. Several adjustments can be made to a pure PRBS to provide for different tests. A main advantage of PRBSs is that, while the PRBSs are deterministic, they have largely the same statistical and spectral properties of random data. PRWSs are parallel versions of PRBSs in which a data pattern is spread across multiple parallel channels so that bits of the PRBS are output in a cyclical sequence across the channels. PRBSs and PRWSs are considered to be interchangeable so long as the context of each (i.e., single channel versus parallel channels) is known.

Memory-based data patterns are data patterns that are stored in memory. The memory-based data patterns can take virtually any form, including that of a PRBS or a PRWS. The size of the available memory and the speed at which the memory-based data pattern held in the memory can be accessed limit memory-based data patterns. Memory-based data patterns can be used to simulate a variety of telecommunications protocols by constructing data patterns that comprise repetitive data patterns (e.g., to simulate headers) and PRBS or PRWS patterns (e.g., to simulate payload data). It is often easier to synchronize PRBS or PRWS patterns than memory-based patterns because, once a specific PRBS or PRWS algorithm or polynomial is known, one only needs a relatively small set of bits to uniquely determine a PRBS or PRWS phase.

Of particular interest in telecommunications-equipment testing are memory-based patterns that conform to the Synchronous Optical Network (SONET) standard or the Synchronous Digital Hierarchy (SDH) standard. SONET and SDH frames include specific overhead bytes. The overhead bytes include Binary Interlace Parity (B) bytes, which are generated by an algorithm known as Binary Interlace Parity 8 (BIP8). The BIP8 algorithm generates the B bytes by performing an exclusive-Or operation on a particular set of bytes in a given frame k and then storing a byte that makes the BIP8 calculation have even parity in a frame k+1. Telecommunication systems typically compute the B bytes at high speed as data passes through the equipment.

Because any test system has finite memory, memory-based tests that use more bits than can be held in memory are accomplished by looping, for example, back to the first frame of data after the last frame in memory has been used. When memory-based data patterns that conform to the SONET or SDH standards are used to test telecommunications systems, the B bytes calculated using the last frame of the memory-based data patterns often do not match the B bytes already present in the first frame of the data pattern. When a mismatch occurs between the B bytes calculated on the last frame do not match the B bytes present in the first frame, parity errors result. What is needed is a scheme that permits construction of valid SONET or SDH memory-based data patterns for performing telecommunications system bit-error-rate testing that minimizes parity errors.

SUMMARY OF THE INVENTION

The present invention provides a system and method that permits valid construction of memory-based bit-error-rate testing of SONET or SDH data patterns used in testing telecommunications equipment. The B bytes of a last frame of the data pattern are calculated and are compared to desired B bytes that have already been stored in appropriate locations of a first frame of the data pattern. Exclusive-Or operations are performed using the desired B bytes and the calculated B bytes using the last frame of the data pattern. The exclusive-Or operations result in correction bytes that are inserted in appropriate locations of the last frame so that calculation of the B bytes using the last frame results in a match between the B bytes calculated using the last frame and the B bytes already present in the first frame. Thus, parity errors due to mismatches between the B bytes calculated using the last frame and the B bytes already present in the first frame are avoided.

A method of constructing a data pattern includes calculating an actual value using selected data of the data pattern. A desired value of the actual-value calculation is determined using the selected data. A correction value to be applied to a portion of the selected data is determined. An operation is performed using the correction value and the portion of the selected data, thereby yielding a replacement value. The portion of the selected data is made equal to the replacement value, thereby yielding adjusted selected data.

An error-rate test system includes a pattern generator. The pattern generator is adapted to input a finite data pattern that includes at least one frame to a device under test. The device under test sequentially processes and outputs data of the input finite data pattern. A correction value includes the result of an exclusive-Or operation of an actual value and a desired value of a calculation performed on a selected portion of at least one frame of the finite data pattern. A replacement value includes an exclusive-Or operation of the correction value and a portion of the selected portion. The portion of the selected portion is made equal to the replacement value.

Embodiments of the present invention permit memory-based data patterns that conform to the SONET or SDH standards to be created. The memory-based data patterns thus created avoid parity errors that can occur when B bytes calculated on the last frame of the data pattern do not match B bytes already present in the first frame of the data pattern. Furthermore, the present invention provides embodiments with other features and advantages in addition to or instead of those discussed above. Many of these features and advantages are apparent from the Description below with reference to the following Drawings.

BRIEF DESCRIPTION OF THE DRAWINGS

A more complete understanding of the present invention can be achieved by reference to the following Detailed Description when taken in conjunction with the accompanying drawings wherein.

DETAILED DESCRIPTION OF THE
EXEMPLARY EMBODIMENTS OF THE
INVENTION

In the following Detailed Description of the Exemplary Embodiment, of the Invention, for purposes of explanation and not limitation, specific details are set forth in order to provide a thorough understanding of embodiments of the present invention. However, it will be apparent to those of ordinary skill in the art that embodiments of the present invention can be practiced in other embodiments that depart from these specific details. In other instances, detailed descriptions of well-known methods, devices, logical code (e.g., hardware, software, firmware), and the like are omitted so as not to obscure description of embodiments of the present invention with unnecessary detail. In particular, aspects of the Synchronous Optical Network (SONET) standard are referenced in order to describe aspects of embodiments of the present invention. It should be understood by those having skill in the art that the present invention can be practiced in embodiments that depart from the SONET standard, such as, for example, those in accordance with the Synchronous Digital Hierarchy (SDH) standard.

Figure 2:
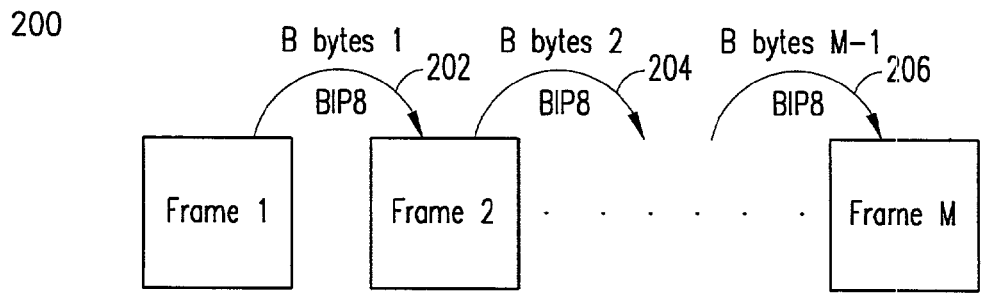
FIG. 2 is a block diagram that illustrates a plurality of SONET frames 200 and also shows a process of storing of B bytes of a given frame of the plurality of frames 200 in a subsequent frame of the plurality of frames 200.
Figure 1:
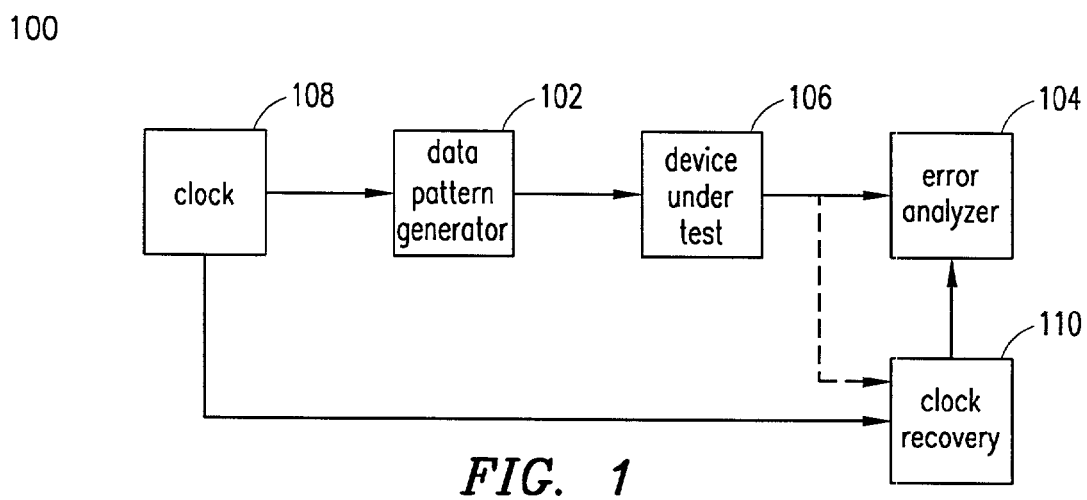
FIG. 1 is a block diagram that illustrates an exemplary bit-error-rate test system.

FIG. 2 is a block diagram that illustrates a plurality of SONET frames 200 and also shows a process of storing of B bytes of a given frame of the plurality of frames 200 in a subsequent frame of the plurality of frames 200. The plurality of frames 200 comprise M frames, frames 1, 2, and M being shown. Frames 3 through M−1 are represented by a dotted line between the frame 2 and the frame M.

A BIP8 algorithm, which is known to those having skill in the art, calculates B bytes 1 using the frame 1 and places the B bytes 1 into predetermined locations in the frame 2 as shown by the arrow 202. It is understood that B bytes 0 are already in place in predetermined positions of the frame 1. The BIP8 algorithm calculates B bytes 2 using the frame 2 and places the B bytes 2 into predetermined locations in the frame 3 (not specifically shown) as shown by the arrow 204. A BIP8 process similar to that illustrated by the arrows 202 and 204 is performed for frames 3 through M−1.

The BIP8 algorithm calculates B bytes M−1 using the frame M31 1 and places the B bytes M−1 into predetermined locations in the frame M as shown by the arrow 206. However, if the BIP8 algorithm calculates B bytes M using the frame M and then attempts to place the B bytes M into predetermined locations in the frame 1, a parity error occurs if the B bytes 0, which are already present in the frame 1 do not match the B bytes M calculated by the BIP8 algorithm on the frame M.

Figure 3:
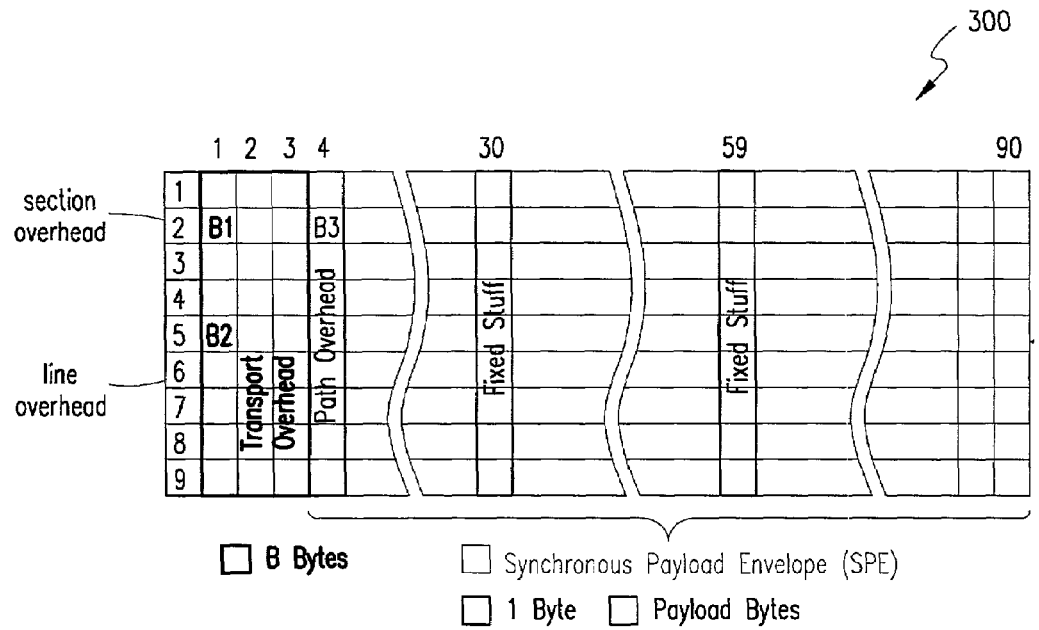
FIG. 3 is a block diagram that illustrates an exemplary SONET frame for use in Optical Carrier level 1 or Synchronous Transport Signal level 1.

A block diagram illustrating an exemplary SONET frame 300 that can be used in Optical Carrier level 1 (OC-1) or Synchronous Transport Signal level 1 (STS-1) is shown in FIG. 3. The frame 300 comprises 9 rows and 90 columns for a total of 810 bytes. The columns 1–4, 30, 59, and 90 are explicitly shown, while the remaining columns are indicated by curved breaks in the frame 300. The frame 300 comprises data bytes labeled "fixed stuff," which cannot be altered, at the columns 30 and 59, path overhead at the column 4, and transport overhead at the columns 1–3. The transport overhead comprises section overhead at the rows 1–3 and line overhead at the rows 4–9. The frame 300 also includes Synchronous Payload Envelope (SPE) at the columns 4–90. The SPE includes the path overhead. Although not shown in FIG. 3, the SPE can be offset by any number of bytes from that shown in FIG. 3 due to, for example, synchronization slips. However, it will be understood by those of ordinary skill that principles of the present invention can be employed regardless of whether the SPE is offset. An SDH frame has a similar structure to the frame 300.

The frame 300 has a single B1 byte located at the column 1 and the row 2. The B1 byte was calculated over an entire previous frame. A single B2 byte is located at the column 1 and the row 5. The B2 byte was calculated over the line overhead and the SPE of the previous frame. A single B3 byte is located at the column 4 and the row 2. The B3 byte was calculated over the SPE of the previous frame. The location of the B1 byte and the B2 byte is constant regardless of whether the SPE is offset. The location of the B3 byte is offset in relation to any offset of the SPE. In addition, numerous blank bytes are present in the overhead portions of the frame 300.

Higher-order SONET frames are typically constructed by multiplexing N STS-1 frames 300 to create an STS-N frame (not shown). However, in order to minimize unnecessary redundancy, not all of the overhead calculations of an STS-1 frame are repeated for an STS-N frame. There are one B1 byte, N B2, and N B3 bytes in a higher-order STS-N frame. Numerous blank bytes are present in the overhead sections of an STS-N frame.

For memory-based tests, a finite block of memory is used; therefore, a continuous test is achieved by recirculating the block of memory as a data loop, which loop can comprise one or more frames. Thus, to test SONET frame-based data, a finite number of frames can be used. The last frame in the sequence computes a set of B bytes (i.e., B1, B2, and B3). The set of B bytes calculated on the last frame often do not match a set of B bytes already present in the first frame. Note that the first frame is the frame that will be the next frame used by the test. Mismatches between the B bytes calculated on the last frame and those present in the first frame result in undesirable parity errors.

The BIP8 algorithm comprises an 8-bit-wide exclusive-Or operation of a plurality of data bytes. In general, a BIPN algorithm comprises an N-bit-wide exclusive-Or operation of a plurality of data bytes. The result of the BIP8 algorithm is a single 8-bit byte which, when subjected to an exclusive-Or operation with the BIP8 of the data, produces even parity (i.e., all zeros across the resulting byte). Embodiments of the present invention include a reverse BIPN algorithm that is based in part on the principle that a first N-bit data pattern can be transformed to any arbitrary second N-bit pattern by performing an exclusive-Or operation of the first N-bit data pattern with an appropriate third N-bit data pattern.

In an embodiment of the invention, which employs the reverse BIPN algorithm, N is 8, the first 8-bit data pattern can be the result of the BIP8 on data of a last frame of a memory-based data pattern, the second 8-bit pattern can be a B-byte (i.e., B1, B2, or B3) in a first frame, and the third 8-bit data pattern can be a correction byte. The correction byte is stored in an appropriate predetermined location in the last frame so that the BIP8 calculation, which uses data in the last frame, produces the correct B byte in the first frame. For an OC-N or STS-N frame, one B1 byte, N B2 bytes, and N B3 bytes must be computed. Therefore, a corresponding number of correction bytes and locations in which to store the correction bytes are needed.

The reverse-BIP8 algorithm of embodiments of the present invention adjusts a SONET or SDH frame so that the calculation of the B bytes (e.g. B1, B2, B3) by the BIP8 algorithm results in a desired set of B bytes (i.e., B1, B2, and B3). Thus, generation of valid SONET or SDH test data for telecommunications testing is possible. In turn, memory-based data patterns that include one or more valid SONET or SDH frames can be generated. Embodiments of the present invention can be implemented that employ as little as one frame to as many frames as necessary. Test data patterns that employ teachings of the present invention are more appealing to telecommunications test customers because, among other things, they avoid parity errors due to B-byte mismatches between the last and first frames of the data pattern.

Referring again to FIG. 3, the B3 byte is calculated using the SPE of the previous frame, the B2 byte is calculated using the SPE and the line overhead of the previous frame, and the B1 byte is calculated over all of the previous frame. Although the frame 300 is an STS-1 frame such that there is only one B2 and one B3 byte in the frame 300, it will be understood by those skilled in the art that N B2 bytes and N B3 bytes and are calculated on an STS-N frame.

The data in SONET and SDH frames is typically scrambled. A scrambling byte is calculated from a PRBS for each byte of the frame 300. The scrambling byte at a given byte position of the frame 300 depends on an equation defining the PRBS and the position of the byte in the frame 300. Because the scrambling equation defines the PRBS such that the scrambling always has the same initial position, for a given STS-N or OC-N frame, the scrambling byte for a given position of the frame is deterministic. Because the equation defining the PRBS and the initial condition are known, the scrambling byte and a corresponding descrambling byte for a given byte position are equal to one another.

The B2 and the B3 bytes of the frame 300 are calculated before a frame immediately preceding the frame 300 is scrambled and are placed in the correct locations in the frame 300 before the frame 300 is scrambled. The B1 byte of the frame 300 is calculated after the frame immediately preceding the frame 300 is scrambled and is placed in the correct location of the frame 300 before the frame 300 is scrambled.

Figures 4, 5, 6:
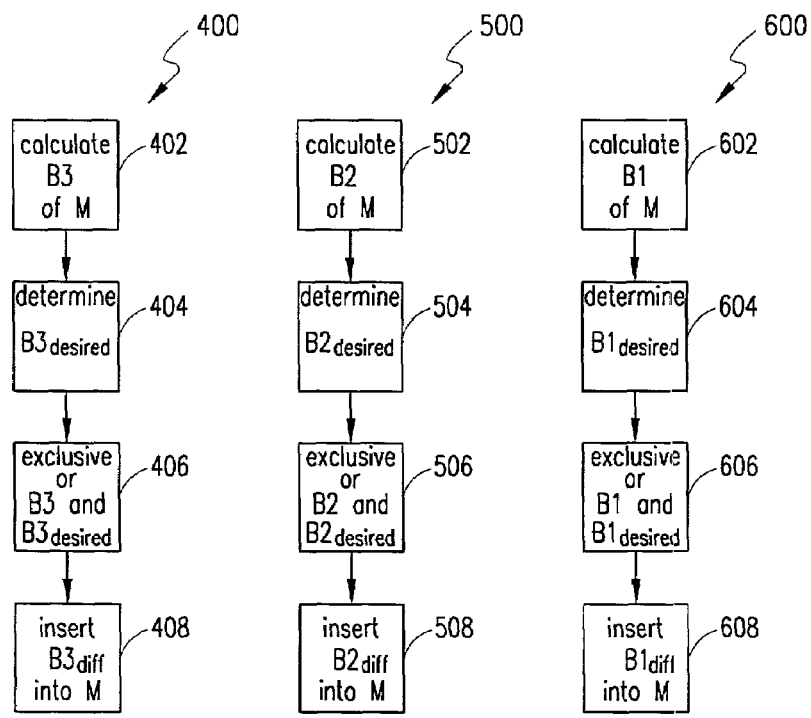
FIG. 4 is a flow chart that illustrates calculation of a B3 byte of a final frame of a data pattern in accordance with teachings of the present invention.
FIG. 5 is a flow chart that illustrates calculation of a B2 byte of a final frame of a data pattern in accordance with teachings of the present invention.
FIG. 6 is a flow chart that illustrates calculation of a B1 byte of a final frame of a data pattern in accordance with teachings of the present invention.

FIG. 4 is a flow chart that illustrates calculation of a B3 byte of a final frame of a data pattern in accordance with teachings of the present invention. Referring now to FIGS. 3 and 4, calculation of a B3 byte using the frame M that will match the B3 byte stored in the frame 1 will be described. A flow 400 begins at step 402, wherein a calculation of B3 for the frame M is performed. At step 404, a determination is made of what a desired value of the calculation of B3 using the frame M, $B3_{desired}$, would be. The determination of step 404 is typically made by either looking ahead to the frame 1 and reading the value of the B3 byte stored therein or reading the value from an auxiliary store or memory.

At step 406, an exclusive-Or operation is performed using the B3 byte calculated on the frame M and the $B3_{desired}$ byte, which calculation yields a correction byte, $B3_{diff}$. The correction byte $B3_{diff}$ is inserted into an appropriate location in the frame M at step 408, so that when the BIP8 algorithm is performed on the frame M, the resulting value of B3 matches the $B3_{desired}$ byte, which is the value of B3 stored in the frame 1. The correction byte $B3_{diff}$ can either be inserted into the appropriate location by substituting the correction byte $B3_{diff}$ directly into a location that includes only zeros or be subjected to an exclusive-Or operation with a byte in the appropriate location and the result of the operation inserted into the appropriate location. Other insertion approaches can be devised without departing from the teachings of the present invention. The appropriate location to store the correction byte $B3_{diff}$ must be in a portion of the frame M that is part of the frame M used by the BIP8 algorithm to generate B3.

FIG. 5 is a flow chart that illustrates calculation of a B2 byte of a final frame of a data pattern in accordance with teachings of the present invention. Referring, now to FIGS. 3 and 5, calculation of a B2 byte using the frame M that will match the B2 byte stored in the frame 1 will be described. A flow 500 begins at step 502, wherein a calculation of B2 for the frame M is performed. At step 504, a determination is made of what a desired value of the calculation of B2 using the frame M, $B2_{desired}$, would be. The determination of step 504 is typically made either by looking ahead to the frame 1 and reading the value of the B2 byte stored therein or reading the value from an auxiliary store or memory.

At step 506, an exclusive-Or operation is performed using the B2 byte calculated on the frame M and the $B2_{desired}$ byte, which calculation yields a correction byte, $B2_{diff}$. The $B3_{diff}$ byte is implicitly included in the calculation of the $B2_{diff}$ correction byte because $B3_{diff}$ has already been inserted into the frame M (as described relative to FIG. 4). However, if the B3 calculation of step 402 is used to avoid recalculation using common bytes shared by the calculation of B3 and B2 at steps 402 and 502, respectively, the calculation performed at step 506 should also include an exclusive-Or operation using $B3_{diff}$, since, at step 402, $B3_{diff}$ has not yet been inserted into the frame 300.

The correction byte $B2_{diff}$ is inserted into an appropriate location in the frame M at step 508, so that when the BIP8 algorithm is performed on the frame M, the resulting value of B2 matches the $B2_{desired}$ byte, which is the value of B2 stored in the frame 1. The correction byte $B2_{diff}$ can either be inserted into the appropriate location by substituting the correction byte $B2_{diff}$ directly into a location that includes only zeros or be subjected to an exclusive-Or operation with a byte in the appropriate location. Other insertion approaches can be devised without departing from the teachings of the present invention. The result of the operation is inserted into the appropriate location as described below.

The appropriate location to store the correction byte $B2_{diff}$ must be in a portion of the frame M that is part of the frame M used by the BIP8 algorithm to generate B2. It is preferable that the appropriate location be in a portion of the frame M that is not used by the BIP8 algorithm to calculate B3. However, adjustments can be made to the flow 500 to account for location of $B2_{diff}$ in a portion of the frame 300 that does affect the calculation of B3 if it is for some reason desirable to locate $B2_{diff}$ in such a location.

FIG. 6 is a flow chart that illustrates calculation of a B1 byte of a final frame of a data pattern in accordance with teachings of the present invention. Referring now to FIGS. 3 and 6, calculation of a B1 byte using the frame M that will match the B1 byte stored in the frame 1 will be described. A flow 600 begins at step 602, wherein a calculation of B1 for the frame M is performed. At step 604, a determination is made of what a desired value of the calculation of B1 using the frame M, $B1_{desired}$, would be. The determination of step 604 is typically made by either looking ahead to the frame 1, which is unscrambled, and reading the value of the B1 byte stored therein or by reading the value from an auxiliary store or memory.

At step 606, an exclusive-Or operation is performed using the B1 byte calculated on the frame M, which has been scrambled, and the $B1_{desired}$ byte. The calculation of step 606 yields a correction byte, $B1_{diff}$. The $B2_{diff}$ byte and the $B3_{diff}$ byte are both implicitly included in the calculation of the $B1_{diff}$ correction byte because $B3_{diff}$ and $B2_{diff}$ have both already been inserted into the frame M (as described relative to FIGS. 4 and 5). However, if the B3 calculation of step 402 or the B2 calculation of step 502 is used to avoid recalculation using common bytes shared by the calculation of B3 or B2 at steps 402 and 502 along with the calculation of B1 at step 602, the calculation performed at step 606 should also include an exclusive-Or operation using $B2_{diff}$ or $B3_{diff}$, since, at steps 402 and 502, respectively, $B3_{diff}$ and $B2_{diff}$, respectively, have not yet been inserted into the frame 300.

The correction byte $B1_{diff}$ is inserted into an appropriate location in the frame M at step 608, so that when the BIP8 algorithm is performed on the frame M, the resulting value of B1 matches the $B1_{desired}$ byte, which is the value of B1 stored in the (unscrambled) frame 1. The correction byte $B1_{diff}$ can either be inserted into the appropriate location by substituting the correction byte $B1_{diff}$ directly into a location that includes only zeros or be subjected to an exclusive-Or operation with a byte in the appropriate location and the result of the operation inserted into the appropriate location. Other insertion approaches can be devised without departing from the teachings of the present invention.

Because the appropriate location for insertion of the $B1_{diff}$ byte already includes the scrambling byte, when B1 is calculated on the frame M following insertion of the correction byte $B1_{diff}$, descrambling of the data in the appropriate location results in a value of B1 that matches that stored in the (unscrambled) frame 1. The appropriate location to store the correction byte $B1_{diff}$ must be in a portion of the frame M that is in a part of the frame M used by the BIP8 algorithm to generate B1. It is preferable that the appropriate location be in a portion of the frame M that is not used by the BIP8 algorithm to calculate B3 or B2. However, adjustments can be made to the flow 600 to account for location of $B1_{diff}$ in a portion of the frame 300 that does affect the calculation of B2 and/or B3 if it is for some reason desirable to locate $B1_{diff}$ in such a location.

Referring again to FIGS. 2, 3, 4, 5, and 6, in constructing the M frames, the reverse BIP8 algorithm can also be used on each frame and the same set of B bytes specified for each of the M frames. For example, B Bytes 0 can be specified for each frame, instead of each frame yielding only the B bytes of the subsequent frame, as shown in FIG. 2. Then, although each of the M frames potentially has different data content, the BIP8 algorithm will always produce B Bytes 0 for each frame; therefore, the M frames can be sequenced in any pattern desired. For example, if M=5, a five-frame test pattern could be as follows: frame 1, frame 2, frame 3 (four times), frame 2, frame 1, frame 3, frame 4 (two times), frame 2, frame 4, before looping back to frame 1. It will be apparent to those having skill in the art that the sequence thus comprised does not need to begin at frame 1, end at frame M, or even include frame 1 or frame M. The reverse BIP8 algorithm can be run on any of the M frames. In addition, some but not all of the M frames can be made to yield the same B bytes.

As will be recognized by those having skill in the art, the innovative concepts described in the present patent application can be modified and varied over a wide range of applications. Although embodiments of the present invention have been primarily described with reference to time-domain testing, such as, for example, bit-error-rate testing, teachings of the present invention can also be applied to frequency-domain testing, such as, for example, spectrum analysis. Accordingly, the scope of patented subject matter should not be limited to any of the specific exemplary teachings discussed, but is instead defined by the following claims.

I claim:

1. A method of constructing a data pattern comprising:
   calculating an actual value using selected data of the data pattern, the data pattern comprises a data loop, the actual value is a function of the content of a preceding frame of the data loop;

determining a desired value of the actual-value calculation using the selected data, the desired value is stored in a first frame of the data loop;

determining a correction value to be applied to a portion of the selected data;

performing an operation using the correction value and the portion of the selected data, thereby yielding a replacement value; and making the portion of the selected data equal to the replacement value, thereby yielding adjusted selected data.

2. The method of claim 1, wherein the data pattern comprises binary data and the step of determining the correction value comprises performing an exclusive-Or operation of the actual value and the desired value.

3. The method of claim 2, wherein the step of performing the operation comprises performing an exclusive-Or operation of the correction value and the portion of the selected data.

4. The method of claim 3, wherein the data pattern is used for time-domain testing.

5. The method of claim 4, wherein the time-domain testing comprises bit-error-rate testing.

6. The method of claim 3, wherein the data pattern is used for frequency-domain testing.

7. The method of claim 6, wherein the frequency-domain testing comprises spectrum analysis.

8. The method of claim 3, wherein the data pattern comprises at least one Synchronous Optical Network (SONET) frame.

9. The method of claim 8, wherein the step of calculating comprises performing a Bit Interlace Parity (BIP) calculation.

10. The method of claim 9, wherein:
the data pattern comprises at least a last frame and a first frame;
the desired value is stored in the first frame;
the actual value is calculated on the last frame.

11. The method of claim 10, wherein the last frame and the first frame are the same frame.

12. The method of claim 9, wherein the data pattern comprises a plurality of frames and a plurality of the plurality of frames include identical B bytes.

13. The method of claim 9, wherein the desired value comprises at least one of a SONET B2 byte, a SONET B3 byte, and a SONET B1 byte.

14. The method of claim 8, wherein the number of frames in the data pattern equals one.

15. The method of claim 3, wherein the data pattern comprises at least one Synchronous Digital Hierarchy (SDH) frame.

16. The method of claim 15, wherein the step of calculating comprises performing a Bit Interlace Parity (BIP) calculation.

17. The method of claim 16, wherein:
the data pattern comprises at least a last frame and a first frame;
the desired value is stored in the first frame;
the actual value is calculated on the last frame.

18. The method of claim 17, wherein the last frame and the first frame are the same frame.

19. The method of claim 16, wherein the data pattern comprises a plurality of frames and a plurality of the plurality of frames include identical B bytes.

20. The method of claim 16, wherein the desired value comprises at least one of a SDH B2 byte, a SDH B3 byte, and a SDH B1 byte.

21. The method of claim 1, further comprising:
calculating a second actual value using second selected data of the data pattern;
determining a second desired value of the second-actual-value calculation using the second selected data;
determining a second correction value to be applied to a portion of the second selected data;
performing an operation using the second correction value and the portion of the second selected data, thereby yielding a second replacement value; and
making the portion of the second selected data equal to the second replacement value, thereby yielding adjusted second selected data.

22. The method of claim 21, wherein the step of determining the second correction value comprises performing an exclusive-Or operation of the second actual value and the second desired value.

23. The method of claim 22, wherein the step of performing the operation using the second correction value comprises performing an exclusive-Or operation of the second correction value and the portion of the second selected data.

24. The method of claim 23, wherein the second selected data and the portion of the second selected data are mutually exclusive.

25. The method of claim 1, wherein the selected data is selected from a single frame of the data pattern.

26. The method of claim 1, further comprising calculating an adjusted actual value using the adjusted selected data, wherein the adjusted actual value equals the desired value.

27. The method of claim 1, wherein the step of determining the correction value comprises performing an exclusive-Or operation of the actual value and the desired value.

28. The method of claim 1, wherein the step of performing the operation comprises performing an exclusive-Or operation of the correction value and the portion of the selected data.

29. An error-rate test system comprising:
a pattern generator adapted to input a finite data pattern comprising at least one frame to a device under test, wherein the device under test sequentially processes and outputs data of the input finite data pattern;
wherein a correction value comprises the result of an exclusive-Or operation of an actual value and a desired value of a calculation performed on a selected portion of at least one frame of the finite data pattern;
wherein a replacement value comprises an exclusive-Or operation of the correction value and a portion of the selected portion; and
wherein the portion of the selected portion is made equal to the replacement value.

30. The system of claim 29, wherein the data pattern comprises at least one Synchronous Optical Network (SONET) frame.

31. The system of claim 30, wherein the actual value comprises the result of a Bit Interlace Parity (BIP) calculation.

32. The system of claim 31 wherein:
the data pattern comprises at least a last frame and a first frame;
the desired value is stored in the first frame;
the actual value is calculated on the last frame.

33. The system of claim 32, wherein the last frame and the first frame are the same frame.

34. The system of claim 29, wherein the data pattern comprises a plurality of frames and a plurality of the plurality of frames include identical B bytes.

35. The system of claim 29, wherein the desired value comprises at least one of a SONET B2 byte, a SONET B3 byte, and a SONET B1 byte.

36. The system of claim 29, wherein the number of frames in the data pattern equals one.

37. The system of claim 29, wherein the data pattern comprises at least one Synchronous Digital Hierarchy (SDH) frame.

38. The system of claim 37, wherein the actual value comprises the result of a Bit Interlace Parity (BIP) calculation.

39. The system of claim 38, wherein:
the data pattern comprises at least a last frame and a first frame;
the desired value is stored in the first frame;
the actual value is calculated on the last frame.

40. The system of claim 39, wherein the last frame and the first frame are the same frame.

41. The system of claim 37, wherein the data pattern comprises a plurality of frames and a plurality of the plurality of frames include identical B bytes.

42. The system of claim 29, wherein the desired value comprises at least one of a SDH B2 byte, a SDH B3 byte, and a SDH B1 byte.

43. The system of claim 29, wherein:
a second actual value is calculated using a second selected portion of the at least one frame;
a second desired value of the second-actual-value calculation is determined using the second selected portion;
a second correction value to be applied to a portion of the second selected portion is determined;
an operation is performed using the second correction value and the portion of the second selected portion, the operation using the second correction value and the portion of the second selected portion yielding a second replacement value; and
the portion of the second selected data is made equal to the second replacement value, thereby yielding an adjusted second selected portion.

44. The system of claim 43, wherein the determination of the second correction value comprises performing an exclusive-Or operation of the second actual value and the second desired value.

45. The system of claim 44, wherein the operation using the second correction value and the portion of the second selected portion comprises performing an exclusive-Or operation of the second correction value and the portion of the second selected portion.

46. The system of claim 45, wherein the selected portion and the portion of the second selected portion are mutually exclusive.

47. The system of claim 29, wherein the selected portion is selected from a single frame of the data pattern.

48. The system of claim 29, wherein an adjusted actual value using the adjusted selected data is calculated and the adjusted actual value equals the desired value.

* * * * *